(12) United States Patent
Liu et al.

(10) Patent No.: US 8,707,123 B2
(45) Date of Patent: Apr. 22, 2014

(54) VARIABLE BARREL SHIFTER

(75) Inventors: Dan Liu, Shanghai (CN); Qi Zuo, Shanghai (CN); Yong Wang, Shanghai (CN); Yang Han, Sunnyvale, CA (US); Shaohua Yang, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 279 days.

(21) Appl. No.: 13/340,974

(22) Filed: Dec. 30, 2011

(65) Prior Publication Data

US 2013/0173994 A1    Jul. 4, 2013

(51) Int. Cl.
*H03M 13/00* (2006.01)
*G11C 29/00* (2006.01)
*H03M 13/03* (2006.01)

(52) U.S. Cl.
USPC ........... 714/752; 714/758; 714/769; 714/779; 714/794; 714/799; 714/801; 714/804

(58) Field of Classification Search
USPC ......... 714/752, 758, 769, 779, 786, 799, 801, 714/804
See application file for complete search history.

(56) References Cited

U.S. PATENT DOCUMENTS

| | | |
|---|---|---|
| 5,278,703 A | 1/1994 | Rub et al. |
| 5,278,846 A | 1/1994 | Okayama |
| 5,317,472 A | 5/1994 | Schweitzer, III |
| 5,325,402 A | 6/1994 | Ushirokawa |
| 5,392,299 A | 2/1995 | Rhines |
| 5,417,500 A | 5/1995 | Martinie |
| 5,513,192 A | 4/1996 | Janku |
| 5,523,903 A | 6/1996 | Hetzler |
| 5,550,810 A | 8/1996 | Monogioudis et al. |
| 5,550,870 A | 8/1996 | Blaker |
| 5,612,964 A | 3/1997 | Haraszti |
| 5,710,784 A | 1/1998 | Kindred |
| 5,717,706 A | 2/1998 | Ikeda |
| 5,802,118 A | 9/1998 | Bliss |
| 5,844,945 A | 12/1998 | Nam |
| 5,898,710 A | 4/1999 | Amrany |
| 5,923,713 A | 7/1999 | Hatakeyama |
| 5,978,414 A | 11/1999 | Nara |
| 5,983,383 A | 11/1999 | Wolf |
| 6,005,897 A | 12/1999 | Mccallister |
| 6,023,783 A | 2/2000 | Divsalar |

(Continued)

OTHER PUBLICATIONS

Axvig et al., "Average Min-Sum Decoding of LDPC Codes", 5th International Symposium on Turbo Codes and Related Topics (2008).

(Continued)

*Primary Examiner* — John J Tabone, Jr.
(74) *Attorney, Agent, or Firm* — Hamilton DeSanctis & Cha

(57) ABSTRACT

In one embodiment a variable barrel shifter includes a shifter operable to apply a cyclic shift to each of a number of portions of a data word, a pivot circuit operable to swap sections of the data word around at least one pivot point in the data word, a first multiplexer operable to select between an input of the variable barrel shifter or an output of the pivot circuit as an input to the shifter, a second multiplexer operable to select between the input of the variable barrel shifter or an output of the shifter as an input to the pivot circuit, and a third multiplexer operable to select between the output of the shifter or the output of the pivot circuit as an output to the variable barrel shifter.

20 Claims, 6 Drawing Sheets

(56) References Cited

U.S. PATENT DOCUMENTS

| | | | |
|---|---|---|---|
| 6,029,264 | A | 2/2000 | Kobayashi |
| 6,065,149 | A | 5/2000 | Yamanaka |
| 6,097,764 | A | 8/2000 | McCallister |
| 6,145,110 | A | 11/2000 | Khayrallah |
| 6,216,249 | B1 | 4/2001 | Bliss |
| 6,216,251 | B1 | 4/2001 | McGinn |
| 6,266,795 | B1 | 7/2001 | Wei |
| 6,317,472 | B1 | 11/2001 | Choi |
| 6,351,832 | B1 | 2/2002 | Wei |
| 6,377,610 | B1 | 4/2002 | Hagenauer |
| 6,381,726 | B1 | 4/2002 | Weng |
| 6,473,878 | B1 | 10/2002 | Wei |
| 6,535,553 | B1 | 3/2003 | Limberg et al. |
| 6,625,775 | B1 | 9/2003 | Kim |
| 6,748,034 | B2 | 6/2004 | Hattori |
| 6,757,862 | B1 | 6/2004 | Marianetti, II |
| 6,785,863 | B2 | 8/2004 | Blankenship |
| 6,810,502 | B2 | 10/2004 | Eidson |
| 6,970,511 | B1 | 11/2005 | Barnette |
| 6,986,098 | B2 | 1/2006 | Poeppelman |
| 7,047,474 | B2 | 5/2006 | Rhee |
| 7,058,873 | B2 | 6/2006 | Song et al. |
| 7,073,118 | B2 | 7/2006 | Greenberg |
| 7,093,179 | B2 | 8/2006 | Shea |
| 7,113,356 | B1 | 9/2006 | Wu |
| 7,117,427 | B2 | 10/2006 | Ophir et al. |
| 7,133,228 | B2 | 11/2006 | Fung et al. |
| 7,184,486 | B1 | 2/2007 | Wu |
| 7,191,378 | B2 | 3/2007 | Eroz et al. |
| 7,203,887 | B2 | 4/2007 | Eroz et al. |
| 7,308,061 | B1 | 12/2007 | Huang |
| 7,310,768 | B2 | 12/2007 | Eidson et al. |
| 7,313,750 | B1 | 12/2007 | Feng |
| 7,370,258 | B2 | 5/2008 | Iancu et al. |
| 7,415,651 | B2 | 8/2008 | Argon |
| 7,502,189 | B2 | 3/2009 | Sawaguchi et al. |
| 7,523,375 | B2 | 4/2009 | Spencer |
| 7,587,657 | B2 | 9/2009 | Haratsch |
| 7,590,168 | B2 | 9/2009 | Raghavan et al. |
| 7,646,829 | B2 | 1/2010 | Ashley et al. |
| 7,702,986 | B2 | 4/2010 | Bjerke et al. |
| 7,730,377 | B2 * | 6/2010 | Hocevar ............ 714/752 |
| 7,752,523 | B1 | 7/2010 | Chaichanavong |
| 7,779,325 | B2 | 8/2010 | Song |
| 7,802,172 | B2 | 9/2010 | Vila Casado et al. |
| 7,952,824 | B2 | 5/2011 | Dziak et al. |
| 7,958,425 | B2 | 6/2011 | Chugg et al. |
| 7,996,746 | B2 | 8/2011 | Livshitz et al. |
| 8,018,360 | B2 | 9/2011 | Nayak |
| 8,201,051 | B2 | 6/2012 | Tan et al. |
| 8,237,597 | B2 | 8/2012 | Liu et al. |
| 8,261,171 | B2 | 9/2012 | Annampedu |
| 8,276,055 | B1 * | 9/2012 | Gunnam et al. ............ 714/801 |
| 8,291,284 | B2 | 10/2012 | Savin |
| 8,295,001 | B2 | 10/2012 | Liu et al. |
| 8,359,522 | B2 * | 1/2013 | Gunnam et al. ............ 714/758 |
| 2006/0256670 | A1 | 11/2006 | Park |
| 2007/0067696 | A1 * | 3/2007 | Bhatt et al. ............ 714/758 |
| 2008/0069373 | A1 | 3/2008 | Jiang |
| 2008/0104474 | A1 * | 5/2008 | Gao et al. ............ 714/752 |
| 2008/0304558 | A1 | 12/2008 | Zhu et al. |
| 2008/0320374 | A1 * | 12/2008 | Prabhakar et al. ........ 714/801 |
| 2009/0132893 | A1 | 5/2009 | Miyazaki |
| 2009/0185643 | A1 | 7/2009 | Fitzpatrick |
| 2010/0014664 | A1 * | 1/2010 | Shirai et al. ............ 380/44 |
| 2011/0164669 | A1 | 7/2011 | Mathew |
| 2011/0167227 | A1 | 7/2011 | Yang |
| 2011/0191650 | A1 * | 8/2011 | Yokokawa ............ 714/752 |
| 2011/0264987 | A1 | 10/2011 | Li |
| 2012/0124118 | A1 | 5/2012 | Ivkovic |
| 2012/0182643 | A1 | 7/2012 | Zhang |
| 2012/0207201 | A1 | 8/2012 | Xia |
| 2012/0212849 | A1 | 8/2012 | Xu |
| 2012/0262814 | A1 | 10/2012 | Li |
| 2012/0265488 | A1 | 10/2012 | Sun |
| 2013/0027416 | A1 * | 1/2013 | Vaithianathan et al. ...... 345/557 |
| 2013/0091403 | A1 * | 4/2013 | Yang et al. ............ 714/763 |

OTHER PUBLICATIONS

Bahl et al., "Optimal decoding of linear codes for minimizing symbol error rate", IEEE Trans. Inform. Theory, vol. 20, pp. 284-287 (Mar. 1974).

Blaum, "High-Rate Modulation Codes for Reverse Concatenation", IEEE Transactions on Magnetics, vol. 43, No. 2 (Feb. 2007).

Casado et al., Multiple-rate low-density parity-check codes with constant blocklength, IEEE Transations on communications, Jan. 2009, vol. 57, pp. 75-83.

Cui et al., "High-Throughput Layered LDPC Decoding Architecture", IEEE Transactions on Very Large Scale Integration (VLSI) Systems, vol. 17, No. 4 (Apr. 2009).

Fan et al., "Constrained coding techniques for soft iterative decoders" Proc. IEEE Global Telecommun. Conf., vol. 1 b, pp. 631-637 (1999).

Fossorier, Marc P.C. "Quasi-Cyclic Low-Density Parity-Check Codes From Circulant Permutation Maricies" IEEE Transactions on Information Theory, vol. 50, No. 8 Aug. 8, 2004.

Gross, "Stochastic Decoding of LDPC Codes over GF(q)", HDPCC Workshop, Tel Aviv (Mar. 2, 2010).

Gunnam et al., "VLSI Architectures for Layered Decoding for Irregular LDPC Codes of WiMax", IEEE ICC Proceedings (2007).

Hagenauer, J. et al A Viterbi Algorithm with Soft-Decision Outputs and its Applications in Proc. IEEE Globecom, pp. 47. 11-47 Dallas, TX Nov. 1989.

Han and Ryan, "Pinning Techniques for Low-Floor Detection/Decoding of LDPC-Coded Partial Response Channels", 5th International Symposium on Turbo Codes &Related Topics, 2008.

Kautz, "Fibonacci Codes for Synchronization Control", IEEE Trans. Info. Theory, vol. 11, No. 2, pp. 284-292 (Apr. 1965).

Kschischang et al., "Factor Graphs and the Sum-Product Algorithm", IEEE Transactions on Information Theory, vol. 47, No. 2 (Feb. 2001).

Leduc-Primeau et al., "A Relaxed Half-Stochastic Iterative Decoder for LDPC Codes", IEEE Communications Society, IEEE Globecom proceedings (2009).

Lee et al., "Partial Zero-Forcing Adaptive MMSE Receiver for DS-CDMA Uplink in Multicell Environments" IEEE Transactions on Vehicular Tech. vol. 51, No. 5, Sep. 2002.

Li et al "Efficient Encoding of Quasi-Cyclic Low-Density Parity Check Codes" IEEE Transactions on Communications on 53 (11) 1973-1973, 2005.

Lim et al. "Convergence Analysis of Constrained Joint Adaptation in Recording Channels" IEEE Trans. on Signal Processing vol. 54, No. 1 Jan. 2006.

Lin et al "An efficient VLSI Architecture for non binary LDPC decoders"—IEEE Transaction on Circuits and Systems II vol. 57, Issue 1 (Jan. 2010) pp. 51-55.

Moon et al, "Pattern-dependent noise prediction in signal-dependent Noise," IEEE JSAC, vol. 19, No. 4 pp. 730-743, Apr. 2001.

Moon et al., "Maximum transition run codes for data storage systems", IEEE Trans. Magn., vol. 32, No. 5, pp. 3992-3994 (Sep. 1996).

Shokrollahi "LDPC Codes: An Introduction", Digital Fountain, Inc. (Apr. 2, 2003).

Spagnol et al, "Hardware Implementation of GF(2^ m) LDPC Decoders", IEEE Transactions on Circuits and Systemsŝi: Regular Papers, vol. 56, No. 12 (Dec. 2009).

Tehrani et al., "Fully Parallel Stochastic LDPC Decoders", IEEE Transactions on Signal Processing, vol. 56, No. 11 (Nov. 2008).

Todd et al., "Enforcing maximum-transition-run code constraints and low-density parity check decoding", IEEE Trans. Magn., vol. 40, No. 6, pp. 3566-3571 (Nov. 2004).

U.S. Appl. No. 13/186,234, Unpublished (filed Jul. 19, 2011) (Haitao Xia).

U.S. Appl. No. 13/213,751, Unpublished (filed Aug. 19, 2011) (Fan Zhang).

U.S. Appl. No. 13/180,495, Unpublished (filed Jul. 11, 2011) (Chung-Li Wang).

U.S. Appl. No. 13/113,219, Unpublished (filed May 23, 2011) (Yang Han).

(56) References Cited

OTHER PUBLICATIONS

U.S. Appl. No. 13/300,078, Unpublished (filed Nov. 18, 2011) (Chung-Li Wang).
U.S. Appl. No. 13/227,416, Unpublished (filed Sep. 7, 2011) (Lei Chen).
U.S. Appl. No. 13/305,551, Unpublished (filed Nov. 28, 2011) (Yang Han).
U.S. Appl. No. 13/174,537, Unpublished (filed Jun. 30, 2011) (Anantha Raman Krishnan).
U.S. Appl. No. 13/296,022, Unpublished (filed Nov. 14, 2011) (Victor Krachkovsky).
U.S. Appl. No. 13/302,119, Unpublished (filed Nov. 22, 2011) (Lei Chen).
U.S. Appl. No. 13/283,549, Unpublished (filed Oct. 27, 2011) (Wu Chang).
U.S. Appl. No. 13/239,683, Unpublished (filed Sep. 22, 2011) (Changyou Xu).
U.S. Appl. No. 13/227,544, Unpublished (filed Sep. 8, 2011) (Shaohua Yang).
U.S. Appl. No. 13/316,953, Unpublished (filed Dec. 12, 2011) (Haitao Xia).
U.S. Appl. No. 13/251,342, Unpublished (filed Oct. 3, 2011) (Haitao Xia).
U.S. Appl. No. 13/174,453, Unpublished (filed Jun. 30, 2011) (Johnson Yen).
U.S. Appl. No. 13/284,767, Unpublished (filed Oct. 28, 2011) (Fan Zhang).
U.S. Appl. No. 13/305,510, Unpublished (filed Nov. 28, 2011) (Lei Chen).
U.S. Appl. No. 13/327,279, Unpublished (filed Dec. 15, 2011) (Wei Feng).
U.S. Appl. No. 13/316,741, Unpublished (filed Dec. 12, 2011) (Yang Han).
U.S. Appl. No. 13/295,150, Unpublished (filed Nov. 14, 2011) (Zongwang Li).
U.S. Appl. No. 13/316,858, Unpublished (filed Dec. 12, 2011) (Zongwang Li).
U.S. Appl. No. 13/269,852, Unpublished (filed Oct. 10, 2011) (Haitao Xia).
U.S. Appl. No. 13/171,615, Unpublished (filed Jun. 29, 2011) (Bradley D. Seago).
U.S. Appl. No. 13/269,832, Unpublished (filed Oct. 10, 2011) (Haitao Xia).
U.S. Appl. No. 13/284,730, Unpublished (filed Oct. 28, 2011) (Fan Zhang).
Vasic, B., "High-Rate Girth-Eight Codes on Rectangular Integer Lattices", IEEE Trans. Communications, vol. 52, Aug. 2004, pp. 1248-1252.
Vasic, B., "High-Rate Low-Density Parity-Check Codes Based on Anti-Pasch Affine Geometries," Proc ICC 2002, pp. 1332-1336.
Weon-Cheol Lee et al., "Vitierbi Decoding Method Using Channel State Info. in COFDM System" IEEE Trans. on Consumer Elect., IEEE Service Center, NY, NY vol. 45, No. 3 Aug. 1999.
Yeo et al., "VLSI Architecture for Iterative Decoders in Magnetic Storage Channels", Mar. 2001, pp. 748-755, IEEE trans. Magnetics, vol. 37, No. 2.
Zhang et al., "Analysis of Verification-Based Decoding on the q-ary Symmetric Channel for Large q", IEEE Trans. On Information Theory, vol. 57, No. 10 (Oct. 2011).
Zhong et al., "High-Rate Quasi-Cyclic LDPC Codes for Magnetic Recording Channel with Low Error Floor", ISCAS, IEEE pp. 3546-3549, May 2006.
Zhong et al., "Quasi Cyclic LDPC Codes for the Magnetic Recording Channel: Code Design and VSLI Implementation", IEEE Transactions on Magnetics, v. 43, pp. 1118-1123, Mar. 2007.
Zhong et al., "Design of VLSI Implementation-Oriented LDPC Codes", IEEE, pp. 670-673, 2003.
Zhong et al., "Joint Code-Encoder Design for LDPC Coding System VLSI Implementation", ISCAS, IEEE pp. 389-392, May 2004.
Zhong, "Block-LDPC: A Practical LDPC Coding System Design Approach", IEEE Trans. On Circuits, Regular Papers, vol. 5, No. 4, pp. 766-775, Apr. 2005.

* cited by examiner

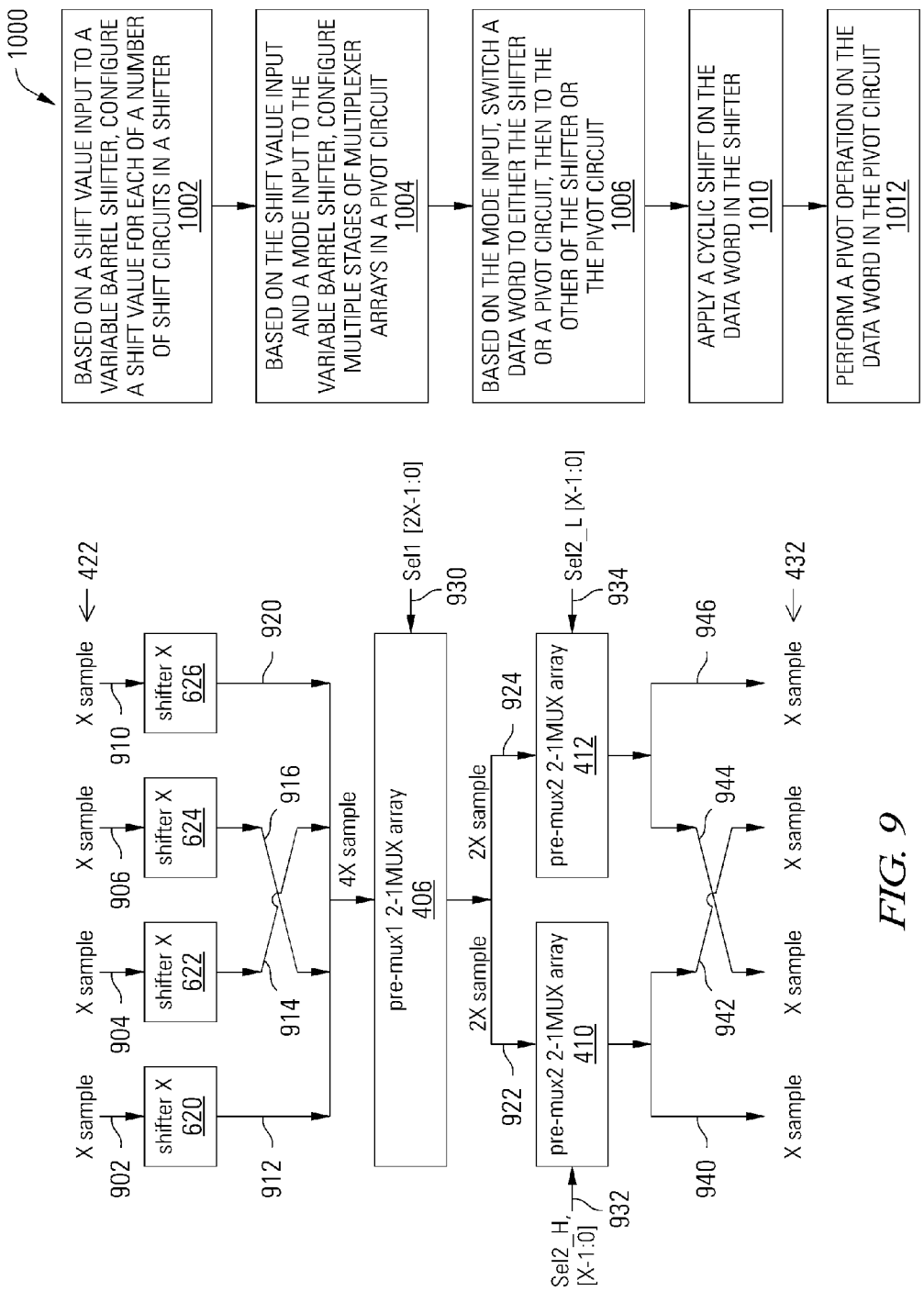

VARIABLE BARREL SHIFTER

BACKGROUND

A barrel shifter is an electronic circuit which shifts a digital data word by a certain number of bits in a cyclic manner, wrapping bits around as they are shifted past the end of the data word. For example, a data word with bits ABCDEF, where the letters represent bit positions rather than bit values, when shifted two bits to the right in a barrel shifter, becomes EFABCD.

Barrel shifters are used in a number of different types of electronic circuits, such as storage systems, cellular telephone systems, and radio transmission systems. For example, a barrel shifter may be used in a Low Density Parity Check (LDPC) layer decoder. An LDPC code is a parity-based code that can be visually represented in a Tanner graph 100 as illustrated in FIG. 1. In an LDPC decoder, multiple parity checks are performed in a number of check nodes 102, 104, 106 and 108 for a group of variable nodes 110, 112, 114, 116, 118, 120, 122, and 124. The connections (or edges) between variable nodes 110-124 and check nodes 102-108 are selected as the LDPC code is designed, balancing the strength of the code against the complexity of the decoder required to execute the LDPC code as data is obtained. The number and placement of parity bits in the group are selected as the LDPC code is designed. Messages are passed between connected variable nodes 110-124 and check nodes 102-108 in an iterative process, passing beliefs about the values that should appear in variable nodes 110-124 to connected check nodes 102-108. Parity checks are performed in the check nodes 102-108 based on the messages and the results are returned to connected variable nodes 110-124 to update the beliefs if necessary. LDPC decoders may be implemented in binary or non-binary fashion. In a binary LDPC decoder, variable nodes 110-124 contain scalar values based on a group of data and parity bits that are retrieved from a storage device, received by a transmission system or obtained in some other way. Messages in the binary LDPC decoders are scalar values transmitted as plain-likelihood probability values or log-likelihood-ratio (LLR) values representing the probability that the sending variable node contains a particular value. In a non-binary LDPC decoder, variable nodes 110-124 contain symbols from a Galois Field, a finite field $GF(p^k)$ that contains a finite number of elements, characterized by size $p^k$ where p is a prime number and k is a positive integer. Messages in the non-binary LDPC decoders are multi-dimensional vectors, generally either plain-likelihood probability vectors or LLR vectors.

The connections between variable nodes 110-124 and check nodes 102-108 may be presented in matrix form as follows, where columns represent variable nodes, rows represent check nodes, and a random non-zero element a(i,j) from the Galois Field at the intersection of a variable node column and a check node row indicates a connection between that variable node and check node and provides a permutation for messages between that variable node and check node:

$$H = \begin{bmatrix} a(1,1) & 0 & 0 & a(1,2) & 0 & a(1,3) & a(1,4) & 0 \\ 0 & a(2,1) & 0 & 0 & a(2,2) & 0 & 0 & a(2,3) \\ a(3,1) & 0 & a(3,2) & 0 & a(3,3) & a(3,4) & 0 & a(3,5) \\ 0 & a(4,1) & 0 & a(4,2) & 0 & 0 & a(4,3) & a(4,4) \end{bmatrix}$$

By providing multiple check nodes 102-108 for the group of variable nodes 110-124, redundancy in error checking is provided, enabling errors to be corrected as well as detected. Each check node 102-108 performs a parity check on bits or symbols passed as messages from its neighboring (or connected) variable nodes. In the example LDPC code corresponding to the Tanner graph 100 of FIG. 1, check node 102 checks the parity of variable nodes 110, 116, 120 and 122. Values are passed back and forth between connected variable nodes 110-124 and check nodes 102-108 in an iterative process until the LDPC code converges on a value for the group of data and parity bits in the variable nodes 110-124. For example, variable node 110 passes messages to check nodes 102 and 106. Check node 102 passes messages back to variable nodes 110, 116, 120 and 122. The messages between variable nodes 110-124 and check nodes 102-108 are probabilities or beliefs, thus the LDPC decoding algorithm is also referred to as a belief propagation algorithm. Each message from a node represents the probability that a bit or symbol has a certain value based on the current value of the node and on previous messages to the node.

A message from a variable node to any particular neighboring check node is computed using any of a number of algorithms based on the current value of the variable node and the last messages to the variable node from neighboring check nodes, except that the last message from that particular check node is omitted from the calculation to prevent positive feedback. Similarly, a message from a check node to any particular neighboring variable node is computed based on the current value of the check node and the last messages to the check node from neighboring variable nodes, except that the last message from that particular variable node is omitted from the calculation to prevent positive feedback. As iterations are performed in the system, messages pass back and forth between variable nodes 110-124 and check nodes 102-108, with the values in the nodes 102-124 being adjusted based on the messages that are passed, until the values converge and stop changing or until processing is halted.

In some applications, multiple barrel shifters are needed to process data words of different lengths. A need therefore remains for efficient barrel shifter architectures for processing data words of different lengths.

BRIEF SUMMARY

Various embodiments of the present invention are related to methods and apparatuses for shifting data, and more particularly to methods and apparatuses for delta shifting data in a variable barrel shifter. For example, in one embodiment a variable barrel shifter includes a shifter operable to apply a cyclic shift to each of a number of portions of a data word, a pivot circuit operable to swap sections of the data word around at least one pivot point in the data word, a first multiplexer operable to select between an input of the variable barrel shifter or an output of the pivot circuit as an input to the shifter, a second multiplexer operable to select between the input of the variable barrel shifter or an output of the shifter as an input to the pivot circuit, and a third multiplexer operable to select between the output of the shifter or the output of the pivot circuit as an output to the variable barrel shifter. The variable barrel shifter thus has configurable internal routing enabling data to be routed first through the pivot circuit or through the shifter, and to be circulated multiple times through the pivot circuit and shifter to perform delta shifts between data words of different sizes. In some embodiments, the variable barrel shifter is included in an LDPC decoder to perform delta shifts between circulants of different sizes and different shift values. For example, the variable barrel shifter may be configured to perform a delta shift from a 4X-bit circulant to four X-bit circulants, and with a specified shift value for each of the 4X-bit circulant and the four X-bit circulants. The variable barrel shifter may also be configured to a delta shift from four X-bit circulants to a 4X-bit circulant, and with a specified shift value for each of the 4X-bit circulant and the four X-bit circulants This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals may be used throughout several drawings to refer to similar components. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

FIG. 9 depicts a data flow diagram of the variable barrel shifter of FIG. 8 in accordance with various embodiments of the present invention;

FIG. 10 depicts a flow diagram showing a method for delta shifting in a variable barrel shifter in accordance with various embodiments of the present invention;

DETAILED DESCRIPTION OF THE INVENTION

Figure 1:
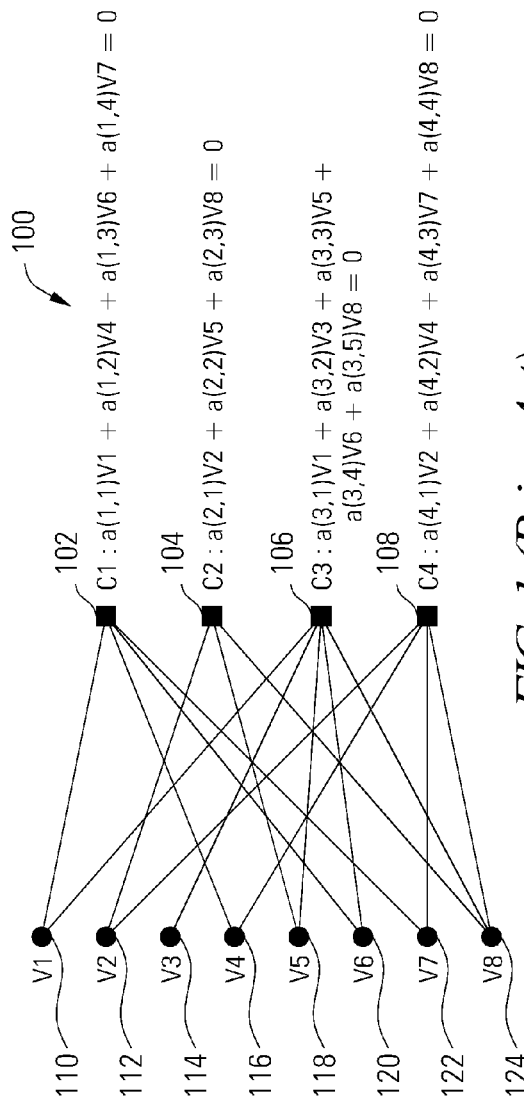
FIG. 1 depicts a Tanner graph of an example prior art LDPC code.

Various embodiments of the present invention are related to methods and apparatuses for shifting data, and more particularly to methods and apparatuses for delta shifting data in a variable barrel shifter. The variable barrel shifter is operable to perform a delta shift with a selectable data word width. The variable barrel shifter is also operable to perform successive delta shift operations with different data word widths. For example, in some embodiments the variable barrel shifter can selectively perform a delta shift on up to four data words of X-bit width in parallel or on a data word of 4X-bit width, each with a specified shift magnitude and direction, and without the need for multiple barrel shifters. The variable barrel shifter can perform cascaded delta shift operations in a single device without requiring multiple barrel shifters, using a flexible internal data flow to reconfigure the shifter and alter the behavior. For example, the variable barrel shifter can be configured to perform a delta shift on a data word of 4X-bit width, followed by four parallel delta shifts of X-bit width on the four quarters of the same data word.

Although the variable barrel shifter is not limited to use with any particular application, in one example embodiment it is included in a multi-level LDPC layer decoder having two different circulant sub-matrix sizes, one of size X and the other of size 4X. Such a multi-level LDPC layer decoder is disclosed in U.S. patent application Ser. No. 13/300,078 filed on Nov. 18, 2011 for a "Multi-Level LDPC Layer Decoder" which is incorporated by reference herein for all purposes.

The multi-level LDPC layer decoder uses quasi-cyclic LDPC codes in which the parity check H matrix is an array of circulant sub-matrices, cyclically shifted versions of identity matrices and null matrices with different cyclical shifts. In some embodiments, the H matrix is constructed based on the finite field GF(8) with M circulant rows and N circulant columns, and with each circulant being a b×b sub-matrix with the form:

$$B_{i,j} = \begin{bmatrix} 0 & \alpha^{h^{i,j}} & 0 & \cdots & 0 \\ 0 & 0 & \alpha^{h^{i,j}} & \cdots & 0 \\ \vdots & \vdots & \vdots & \ddots & \vdots \\ 0 & 0 & 0 & \cdots & \alpha^{h^{i,j}} \\ \alpha^{h^{i,j}} & 0 & 0 & \cdots & 0 \end{bmatrix}$$

For example, given a 12×108 H matrix of 48×48 circulants, the overall row length is 108×48 or 5184, and the overall column height is 12×48 or 576. In the multi-level LDPC layer decoder, the parity check H matrix of the LDPC code is partitioned into L layers, with the H matrix being processed row by row and the circulants being processed layer by layer. As the rows are processed, the column results are updated based on each row result. Layered decoding can reduce the time to converge on a result in the decoder in some cases.

The multi-level LDPC layer decoder performs min-sum based layered decoding of non-binary LDPC codes which provides low-complexity decoding over large Galois Fields and that does not require forward and backward recursions, sorting or dynamic programming. In the min-sum based decoding, also referred to as simplified min-sum decoding, the check nodes calculate the minimum sub-message $min_1(d)$, the index $idx(d)$ of $min_1(d)$, and the sub-minimum or next minimum sub-message $min_2(d)$, or minimum of all sub-messages excluding $min_1(d)$, for each nonzero symbol d in the Galois Field based on all extrinsic V2C messages from neighboring variable nodes. In other words, the sub-messages for a particular symbol d are gathered from messages from all extrinsic inputs, and the $\min_1(d)$, idx(d) and $\min_2(d)$ is calculated based on the gathered sub-messages for that symbol d. For a Galois Field with q symbols, the check node will calculate the $\min_1(d)$, idx(d) and $\min_2(d)$ sub-message for each of the q−1 non-zero symbols in the field except the most likely symbol.

Figure 2:
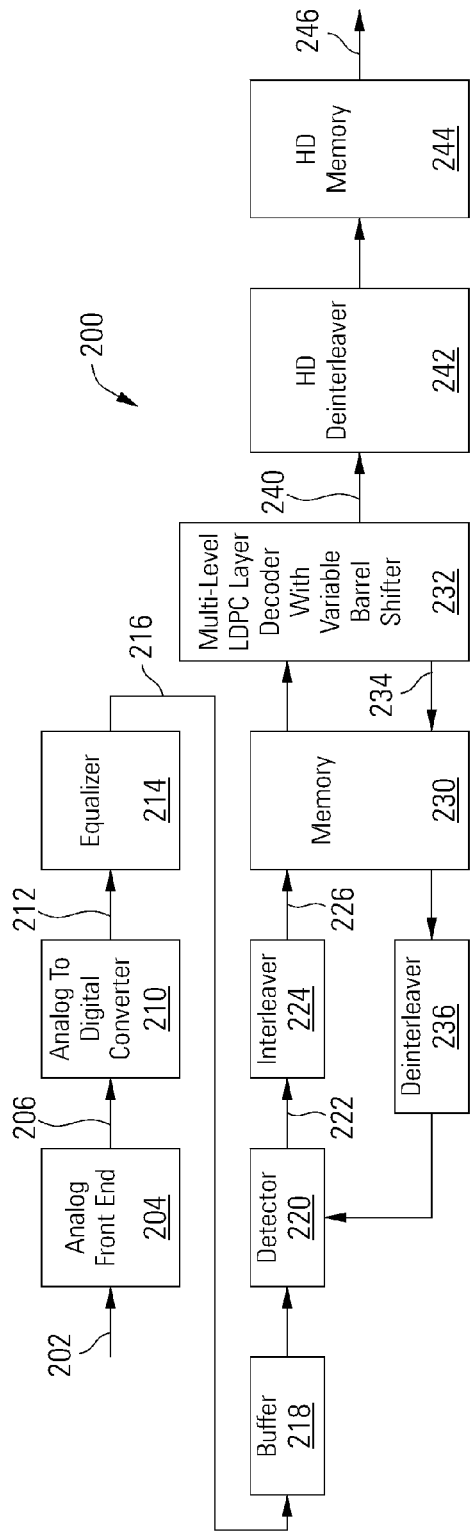
FIG. 2 depicts a block diagram of a read channel with an LDPC decoder with variable barrel shifter which may be used to retrieve or receive stored or transmitted data in accordance with various embodiments of the present invention.

Turning to FIG. 2, the multi-level LDPC layer decoder with a variable barrel shifter may be included, for example, in a read channel 200 used to process an analog signal 202 and to retrieve user data bits from the analog signal 202 without errors. In some cases, analog signal 202 is derived from a read/write head assembly in a magnetic storage medium. In other cases, analog signal 202 is derived from a receiver circuit that is operable to receive a signal from a transmission medium. The transmission medium may be wireless or wired such as, but not limited to, cable or optical connectivity. Based upon the disclosure provided herein, one of ordinary skill in the art will recognize a variety of sources from which analog signal 202 may be derived.

The read channel 200 includes an analog front end 204 that receives and processes the analog signal 202. Analog front end 204 may include, but is not limited to, an analog filter and an amplifier circuit as are known in the art. Based upon the disclosure provided herein, one of ordinary skill in the art will recognize a variety of circuitry that may be included as part of analog front end 204. In some cases, the gain of a variable gain amplifier included as part of analog front end 204 may be modifiable, and the cutoff frequency and boost of an analog filter included in analog front end 204 may be modifiable. Analog front end 204 receives and processes the analog signal 202, and provides a processed analog signal 206 to an analog to digital converter 210.

Analog to digital converter 210 converts processed analog signal 206 into a corresponding series of digital samples 212. Analog to digital converter 210 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 212 are provided to an equalizer 214. Equalizer 214 applies an equalization algorithm to digital samples 212 to yield an equalized output 216. In some embodiments of the present invention, equalizer 214 is a digital finite impulse response filter circuit as is known in the art. Data or codewords contained in equalized output 216 may be stored in a buffer 218 until a data detector 220 is available for processing.

The data detector 220 performs a data detection process on the received input, resulting in a detected output 222. In some embodiments of the present invention, data detector 220 is a Viterbi algorithm data detector circuit, or more particularly in some cases, a maximum a posteriori (MAP) data detector circuit as is known in the art. In these embodiments, the detected output 222 contains log-likelihood-ratio (LLR) information about the likelihood that each bit or symbol has a particular value. Based upon the disclosure provided herein, one of ordinary skill in the art will recognize a variety of data detectors that may be used in relation to different embodiments of the present invention. Data detector 220 is started based upon availability of a data set in buffer 218 from equalizer 214 or another source.

The detected output 222 from data detector 220 is provided to an interleaver 224 that protects data against burst errors. Burst errors overwrite localized groups or bunches of bits. Because LDPC decoders are best suited to correcting errors that are more uniformly distributed, burst errors can overwhelm LDPC decoders. The interleaver 224 prevents this by interleaving or shuffling the detected output 222 from data detector 220 to yield an interleaved output 226 which is stored in a memory 230. The interleaved output 226 from the memory 230 is provided to a multi-level LDPC layer decoder 232 which performs parity checks on the interleaved output 226, ensuring that parity constraints established by an LDPC encoder (not shown) before storage or transmission are satisfied in order to detect and correct any errors that may have occurred in the data during storage or transmission or during processing by other components of the read channel 200.

Multiple detection and decoding iterations may be performed in the read channel 200, referred to herein as global iterations. (In contrast, local iterations are decoding iterations performed within the LDPC decoder 232.) To perform a global iteration, LLR values 234 from the LDPC decoder 232 are stored in memory 230, deinterleaved in a deinterleaver 236 to reverse the process applied by interleaver 224, and provided again to the data detector 220 to allow the data detector 220 to repeat the data detection process, aided by the LLR values 234 from the LDPC decoder 232. In this manner, the read channel 200 can perform multiple global iterations, allowing the data detector 220 and LDPC decoder 232 to converge on the correct data values.

The LDPC decoder 232 also produces hard decisions 240 about the values of the data bits or symbols contained in the interleaved output 226 of the interleaver 224. For binary data bits, the hard decisions may be represented as 0's and 1's. In a GF(4) LDPC decoder, the hard decisions may be represented by four field elements 00, 01, 10 and 11.

The hard decisions 240 from LDPC decoder 232 are deinterleaved in a hard decision deinterleaver 242, reversing the process applied in interleaver 224, and stored in a hard decision memory 244 before being provided to a user or further processed. For example, the output 246 of the read channel 200 may be further processed to reverse formatting changes applied before storing data in a magnetic storage medium or transmitting the data across a transmission channel.

Figure 3:
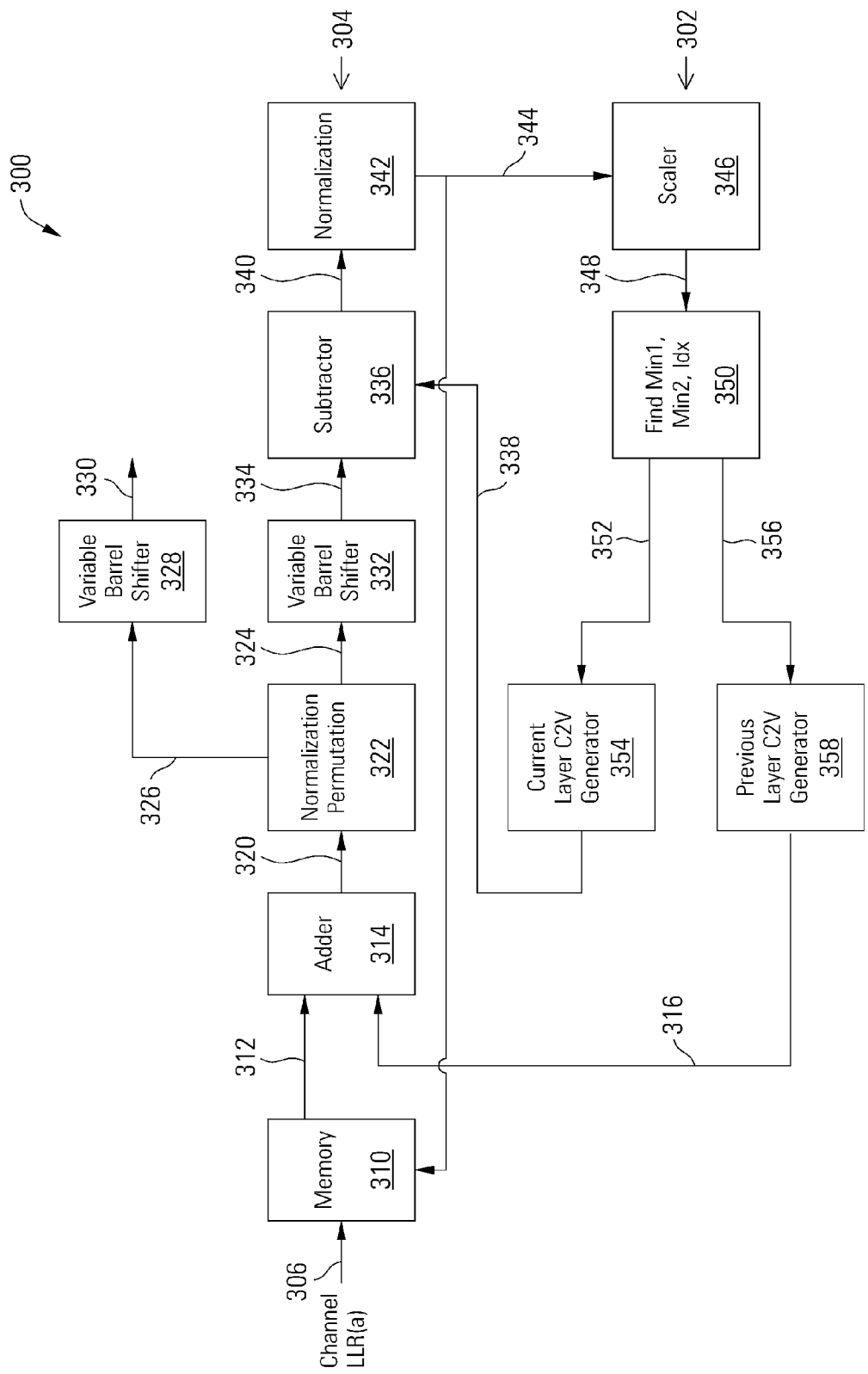
FIG. 3 depicts a block diagram of a multi-level LDPC layer decoder with variable barrel shifter in accordance with various embodiments of the present invention.

Turning to FIG. 3, a multi-level LDPC layer decoder 300 with variable barrel shifter is illustrated in block-diagram form in accordance with various embodiments of the present invention. The multi-level LDPC layer decoder 300 generates C2V messages from a check node processor 302 to a variable node processor 304 using min-sum based check node calculations. Incoming LLR values for data to be decoded are received on an input 306 and stored in a Q value memory 310. The memory 310 stores soft LLR input values from the input 306 and Q values of each symbol, representing the likelihood that an input symbol has the value of each element of the Galois Field. For a GF(4) LDPC decoder, the Q values consist of one hard decision and three soft LLR values, or four soft LLR values in an equivalent but alternative format.

The memory 310 yields stored Q values 312 or $Q_n(a)$ for the layer previous to the layer currently being processed, also referred to herein as the previous layer and the connected layer. An adder 314 adds the Q values 312 to previous layer C2V messages 316 or $R_{1,n}(a)$ in array fashion to produce S messages 320 or $S_n(a)$ containing total soft LLR values for the previous layer.

The S messages 320 are provided to a normalization and permutation circuit 322, which converts the format of the S messages 320 from eight soft LLR values to the equivalent content but different format of one hard decision and seven soft LLR values (for a GF(8) embodiment), and which applies a permutation to rearrange the variable node updated values to prepare for the check node update and to apply the permutations specified by the non-zero elements of the H matrix. The normalization and permutation circuit 322 yields P messages 324 or $P_n(a)$ for the previous layer. The normalization and permutation circuit 322 also yields soft LLR values 326 which are provided to a variable barrel shifter 328. Variable barrel shifter 328 rearranges the soft LLR values 326 to column order, performs a barrel shift or cyclic shift which shifts the normalized soft LLR values 326 from the previous layer to the current layer, and which yields hard decisions 330 or $a_n^*$, calculated as $\operatorname{argmin}_a S_n(a)$.

The P messages 324 from the normalization and permutation circuit 322 are also provided to another variable barrel shifter 332, which shifts the symbol values in the normalized LLR P messages 324 to generate the next circulant submatrix, yielding current layer P messages 334 which contain the total soft LLR values of the current layer. The multi-level LDPC layer decoder 300 has two different circulant sizes, X bits and 4X bits. Thus, which performing a delta shift between a circulant of 4X bits and four circulants of X bits each, the variable barrel shifter 332 is operable to un-shift the 4X-bit circulant and then shift the four X-bit circulants and vice versa.

The current layer P messages 334 are provided to a subtractor 336 which subtracts the current layer C2V messages 338, or $R_{2,n}(a)$, from the current layer P messages 334, yielding D messages 340, or $D_n(a)$.

D messages 340 are provided to a normalization circuit 342 which converts the format of the D messages 340 from eight soft LLR values to the equivalent content but different format of one hard decision and seven soft LLR values, yielding new Q messages 344, or $Q_{2,n}(a)$, also referred to as V2C messages, for the current layer. The Q messages 344 are stored in memory 310, overwriting previous channel or calculated values for the current layer, and are also provided to a scaler 346 which scales the Q messages 344 to yield scaled V2C messages 348, or $T_{2,n}(a)$.

V2C messages 348 are provided to a min finder circuit 350 which calculates the minimum value $\min_1(d)$, second or next minimum value $\min_2(d)$ and the index of the minimum value idx(d). The min finder circuit 350 also calculates the signs of the V2C messages 348 and tracks the sign value of each non-zero element of the H matrix and the cumulative sign for the current layer. The min finder circuit 350 yields the current layer minimum, next minimum and index values with the sign values 352 to a current layer C2V generator 354, which calculates the current layer C2V messages 338, or $R_{2,n}(a)$. The min finder circuit 350 also yields the previous layer minimum, next minimum and index values with the sign values 356 to a previous layer C2V generator 358, which calculates the previous layer C2V messages 316, or $R_{1,n}(a)$. The current layer C2V generator 354 and previous layer C2V generator 358 generate the C2V or R messages 338 and 316 based on the final state and current column index of the symbol. If the current column index is equal to the index of the minimum value, then the value of R is the second minimum value. Otherwise, the value of R is the minimum value of that layer. The sign of R is the XOR of the cumulative sign and the current sign of the symbol.

In summary, the variable node processor 304 and the check node processor 302 operate together to perform layered decoding of non-binary or multi-level data. The variable node processor 304 generates variable node to check node messages (V2C messages) and calculates perceived values based on check node to variable node messages (C2V messages). The check node processor 302 generates C2V messages and calculates checksums based on V2C messages, using a min finder circuit operable to identify a minimum, a next minimum and an index of minimum value in the V2C messages.

Figure 4:
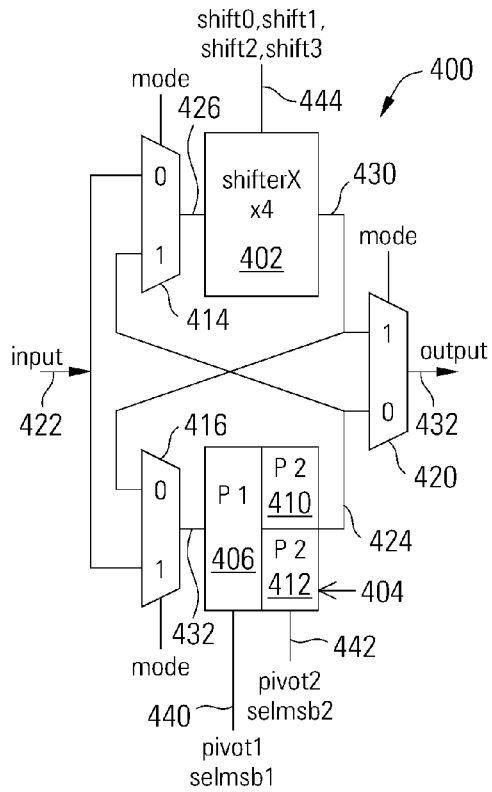
FIG. 4 depicts a block diagram of a variable barrel shifter in accordance with various embodiments of the present invention.

Turning to FIG. 4, block diagram of a variable barrel shifter 400 is depicted in accordance with various embodiments of the present invention. As disclosed above, the variable barrel shifter 400 may be used to perform delta shifts on data words of varying widths, and may also be internally reconfigured to perform successive delta shifts of varying widths and with specified shift magnitudes and directions. The example embodiment disclosed in FIG. 4 is adapted to perform delta shifts in an LDPC decoder such as that disclosed above, and in particular, to perform an un-shift on a data word or circulant of 4X bits, followed by a shift on four X-bit data words or circulants made up of four portions of the 4X-bit data word. The variable barrel shifter 400 may also reverse the operation, by performing four un-shifts on four X-bit data words or circulants followed by a shift on the 4X-bit data word or circulant made up of a combination of the four X-bit circulants. The variable barrel shifter 400 performs these successive and flexible operations by rerouting internal data flow rather than by cascading multiple shifters.

The variable barrel shifter 400 includes four X-bit shifters 402, which can be configured to operate independently to perform delta shifts of configurable magnitude and direction on each of four X-bit circulants, or to operate collectively to perform a delta shift of configurable magnitude and direction on a single 4X-bit circulant. The variable barrel shifter 400 also includes a pre-mux 404 (also referred to herein as a pivot circuit), a multi-stage multiplexer with a first stage 406 and second stages 410 and 412 that perform pivot operations on data words. The first stage pre-mux 406 receives a 4X-bit input data word and provides two 2X-bit output data words to each of second stage pre-muxes 410 and 412. Second stage pre-muxes 410 and 412 each receive one of the 2X-bit data words and yields two X-bit data words. Thus, the 4X-bit input data word is divided by the pre-mux 404 into four X-bit data words, while performing specified pivot operations.

The internal data flow in the variable barrel shifter 400 may be rerouted using multiplexers 414, 416 and 420, which in this example embodiment have 4X-bit wide inputs and outputs. A first multiplexer 414 is a 2-1 multiplexer, selecting between the input 422 of the variable barrel shifter 400 in mode 0 or the output 424 of the pre-mux 404 in mode 1, and yielding the selected data signal 422 or 424 as the input 426 to the four X-bit shifters 402. A second multiplexer 416 is a 2-1 multiplexer, selecting between the input 422 of the variable barrel shifter 400 in mode 1 or the output 430 of the four X-bit shifters 402 in mode 0, and yielding the selected data signal 422 or 430 as the input 432 to the pre-mux 404. A third multiplexer 420 is a 2-1 multiplexer, selecting between the output 424 of the pre-mux 404 in mode 0 or the output 430 of the four X-bit shifters 402 in mode 1, and yielding the output 432 of the variable barrel shifter 400. The multiplexers 414 and 416 may change modes during a shift operation to perform successive delta shifts with different data word widths, circulating the data word inside the variable barrel shifter 400 until the desired delta shifts have been completed, at which point the output 432 is ready for use. The shift and pivot settings can also be set to zero, for example allowing data to pass straight through the pre-mux 404 without alteration for further flexibility in routing data.

Notably, the variable barrel shifter 400 is not limited to two data word widths, or to any particular ratio between the data word widths it is adapted to shift.

The variable barrel shifter 400 is controlled by parameters pivot1 and selmsb1 440 which set the pivot point and the section of data that is swapped around the pivot point (referred to herein as the pivot section) for first stage pre-mux 406. The variable barrel shifter 400 is also controlled by pivot2 and selmsb2 442 which set the pivot point and the pivot section for second stage pre-mux 412, and by shift values shift0, shift1, shift2, shift3 444 which specify the shift magnitude for each of the four X-bit shifters 402. As will be disclosed in more detail below, the pivot1 and selmsb1 440 and pivot2 and selmsb2 442 may be calculated or retrieved from storage in the variable barrel shifter 400 based on an initial_shift value, and the shift values shift0, shift1, shift2, shift3 444 may be calculated or retrieved based on the pivot2 value and on the initial shift and the desired ending shift, depending on the mode in which the variable barrel shifter 400 is used.

Figure 5:
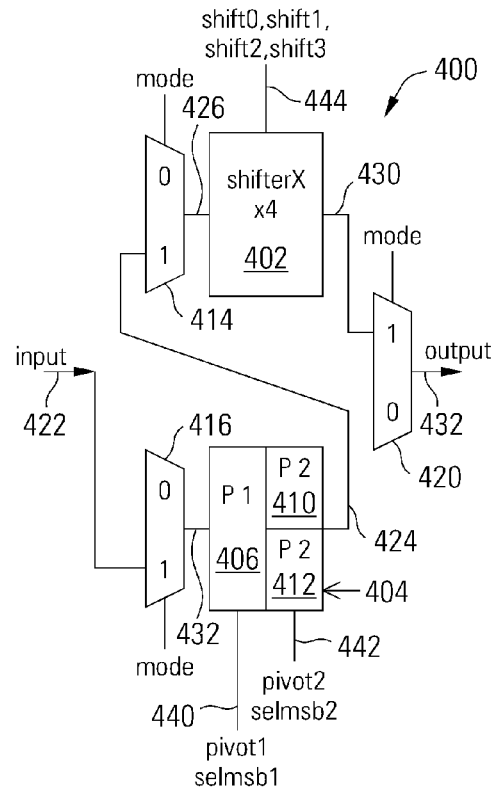
FIG. 5 depicts a block diagram of the variable barrel shifter of FIG. 4 configured to perform a delta cyclic shift on a data word of 4X bits to four data words of X bits in accordance with various embodiments of the present invention.
Figure 6:
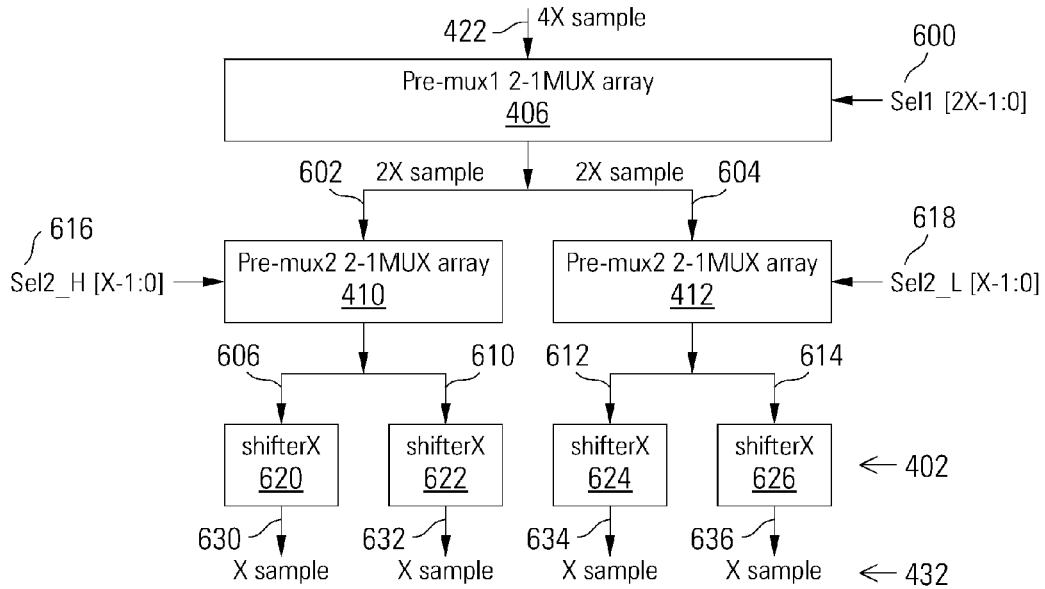
FIG. 6 depicts a data flow diagram of the variable barrel shifter of FIG. 5 in accordance with various embodiments of the present invention.

Turning to FIG. 5, the operation of the variable barrel shifter 400 is illustrated in mode 1, in which the data word at the input 422 passes through multiplexer 416, pre-mux 404, multiplexer 414, four X-bit shifters 402, and multiplexer 420 to the output 432 in that order. Only a single stage of operation is illustrated, although as disclosed above, multiple stages may be performed successively by circulating data internally. The data flow is illustrated in FIG. 6, in which a 4X-bit data word is provided at input 422 to first stage pre-mux 406, an array of 2-1 multiplexers controlled by a 2X-bit select signal Sel1[2X-1:0] 600 to divide the 4X-bit data word into two 2X-bit outputs 602 and 604. Additionally, the first stage pre-mux 406 performs a pivot operation, swapping a portion of the upper and lower halves of the 4X-bit input data word around a pivot point in the upper and lower halves of the 4X-bit input data word. The first stage pre-mux 406 may be configured to swap the most significant bits above the pivot point in the upper half of the 4X-bit input data word with the most significant bits above the pivot point in the lower half of the 4X-bit input data word, or to swap the least significant bits below the pivot point in the upper half of the 4X-bit input data word with the least significant bits below the pivot point in the lower half of the 4X-bit input data word. The 2X-bit output 602 is provided to second stage pre-mux 410, an array of 2-1 multiplexers that divides the 2X-bit data word into two X-bit outputs 606 and 610. The second stage pre-mux 410 performs an operation similar to that of first stage pre-mux 406, performing both a dividing and pivoting operation. The 2X-bit output 604 is provided to second stage pre-mux 412, an array of 2-1 multiplexers that divides the 2X-bit data word into two X-bit outputs 612 and 614. The second stage pre-mux 412 also performs an operation similar to that of first stage pre-mux 406, performing both a dividing and pivoting operation. The four X-bit outputs 606, 610, 612 and 614 are each shifted in X-bit shifters 620, 622, 624 and 626, respectively, yielding shifted X-bit outputs 630, 632, 634 and 636.

Figure 7:
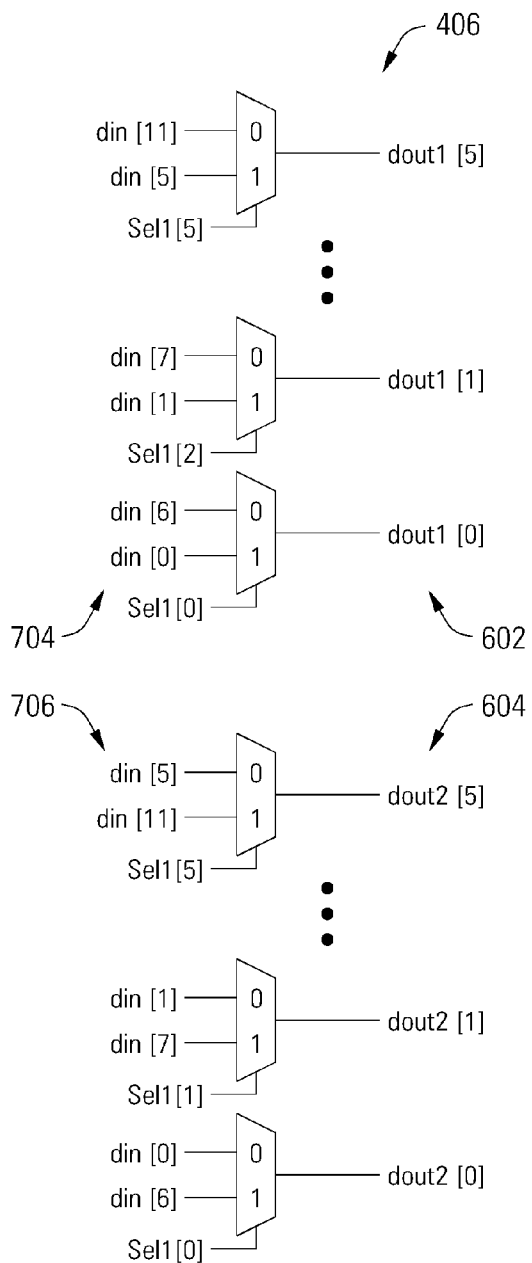
FIG. 7 depicts a block diagram of a first stage pre-mux suitable for use in a variable barrel shifter in accordance with various embodiments of the present invention.

Turning to FIG. 7, an example block diagram of the first stage pre-mux 406 is depicted in accordance with various embodiments of the present invention. In this example, the first stage pre-mux 406 is adapted to process a 12-bit input data word din[11:0] and yield two 6-bit output data words $dout_1[5:0]$ 602 and $dout_2[5:0]$ 604, using two series 704 and 706 of 2-1 multiplexers, respectively. The 6-bit enable signal Sel1[5:0] is shared by the two series 704 and 706 of 2-1 multiplexers as illustrated. A pivot1 and selmsb1 input 440 (see FIG. 4) sets the pivot point and selects either the most significant bits (msb) or least significant bits (lsb) of the input data word as the pivot section to swap. In the example embodiment, the pivot1 parameter and the selmsb1 parameter are derived from a shift value initial_shift specified to the variable barrel shifter 400 according to Equations 1 and 2:

$$\text{pivot1} = (\text{initial}_{shift} \geq 2X \text{?} \text{initial}_{shift} - 2X : \text{initial\_shift}) \quad (\text{Eq 1})$$

$$\text{selmsb1} = (\text{initial}_{shift} \geq 2X \text{?} 1 : 0) \quad (\text{Eq 2})$$

For example, given a 12-bit input data word (4X=12), and an initial_shift of 7, initial_shift is greater than 2X (7>=6). Pivot1 is therefore 7-6 or 1, dividing the upper and lower halves of the 12-bit input data word at bit position 1, referenced from the most significant bit. In other words, the upper half of the 12-bit input data word, bits [11:6], are divided into the 1 most significant bit, bit [11], and the 5 least significant bits, bits [10:6]. Similarly, the lower half of the 12-bit input data word, bits [5:0], are divided into the 1 most significant bit, bit [5], and the 5 least significant bits, bits [4:0]. The selmsb1 parameter is 1 if initial_shift is greater than 2X, otherwise 0. In the present example, initial_shift is greater than 2x, thus selmsb1 is 1. If selmsb1 is 1, the least significant bits are the pivot section to swap, meaning that bits [10:6] are swapped with bits[5:0]. If selmsb1 is 0, the most significant bits are the pivot section to swap, meaning that bit [11] is swapped with bit[6]. The selmsb1 thus controls the pivot section, selecting whether least significant bits below the pivot point or most significant bits above the pivot point are swapped. The pivot points in the 2X-bit upper half and the 2X-bit lower half of the 4X-bit input data word provide one boundary of the pivot sections, with the other boundary provided by the start or end of the 2X-bit data words.

When the variable barrel shifter 400 is routed as illustrated in FIG. 5, the 2X-bit Sel1[5:0] signal used to configure the multiplexers in first stage pre-mux 406 are set based on pivot1 and selmsb1 according to Equation 3:

$$\left\{ \underbrace{\{0 \ldots 0\}}_{\text{pivot1 bits}}, \underbrace{\{1 \ldots 1\}}_{(2X-\text{pivot1})\text{bits}} \right\} \text{when } selmsb1 = 1 \quad (\text{Eq 3})$$

$$\left\{ \underbrace{\{1 \ldots 1\}}_{\text{pivot1 bits}}, \underbrace{\{0 \ldots 0\}}_{(2X-\text{pivot1})\text{bits}} \right\} \text{when } selmsb1 = 0$$

The second stage pre-mux 410 and second stage pre-mux 412 may be implemented as scaled-down versions of the first stage pre-mux 406 illustrated in FIG. 7, each dividing and pivoting a 2X-bit input data word and yielding two X-bit output data words. The second stage pre-mux 410 and second stage pre-mux 412 are controlled by an X-bit (or 3-bit in this example) enable signal Sel2[2:0], a pivot2 and selmsb2 input 442 (see FIG. 4) that sets the pivot point and selects either the most significant bits (msb) or least significant bits (lsb) of the input data words to swap. The pivot2 parameter and the selmsb2 parameters are derived from the pivot1 parameter according to Equations 4 and 5:

$$\text{pivot2} = (\text{pivot1} \geq X \text{?} \text{pivot1} - X : \text{pivot1}) \quad (\text{Eq 4})$$

$$\text{selmsb2} = (\text{pivot1} \geq X \text{?} 1 : 0) \quad (\text{Eq 5})$$

Thus, continuing with the example, pivot1 is not greater than or equal to X or 3, so pivot2 is equal to pivot1 or 1, and selmsb2 is 0. Two X-bit select signals Sel2_H[X-1:0] 616 and Sel2_L[X-1:0] 618 are used to configure 2-1 multiplexers in the second stage pre-mux 410 and second stage pre-mux 412, both set based on pivot2 and selmsb2 according to Equation 6:

$$\left\{\underbrace{\{0 \ldots 0\}}_{pivot2 \; bits}, \underbrace{\{1 \ldots 1\}}_{(X-pivot2)bits}\right\} \text{when } selmsb2 = 1 \qquad \text{(Eq 6)}$$

$$\left\{\underbrace{\{1 \ldots 1\}}_{pivot2 \; bits}, \underbrace{\{0 \ldots 0\}}_{(X-pivot2)bits}\right\} \text{when } selmsb2 = 0$$

The X-bit shifters 620, 622, 624 and 626 use pivot2 as the value for the shift parameters shift0, shift1, shift2, shift 3 444 (see FIG. 4), each applying the same shift to yield shifted X-bit outputs 630, 632, 634 and 636. In operation, given a 12-bit input data word of {ABC DEF GHI JKL}, where letters are used to represent bit positions, and a shift value of 7, pivot1 is 1, selmsb1 is 1, pivot2 is 1, and selmsb2 is 0, and shift0, shift1, shift2, shift 3 are 1 as described above. The first stage pre-mux 406 yields a 2X-bit output 602 of {AHI JKL} and a 2X-bit output 604 of {GBC DEF}. Given a pivot point pivot2 of 1, the upper half of 2X-bit output 602 is divided in second stage pre-mux 410 between bits {A} and {HI}, and the lower half is divided between bits {J} and {KL}. Because selmsb2 is 0, the most significant bits are swapped, resulting in an X-bit output 606 of {JHI} and an X-bit output 610 of {AKL}. Similarly, second stage pre-mux 412 processes 2X-bit output 604 to yield an X-bit output 612 of {DBC} and an X-bit output 614 of {GEF}. The shift0, shift1, shift2, shift3 parameters for X-bit shifters 620, 622, 624 and 626 are all pivot2 or 1, thus X-bit outputs 630, 632, 634 and 636 are {HIJ}, {KLA}, {BCD} and {EFG} respectively. The input data word {ABC DEF GHI JKL} is thus shifted by 7 in variable barrel shifter 400 to yield {HIJ KLA BCD EFG}.

The result is the same whether the pivot operation is performed before the shift operation as in FIGS. 5 and 6, or after. This property allows data words to be circulated in the variable barrel shifter 400 allowing successive delta shift operations.

Figure 8:
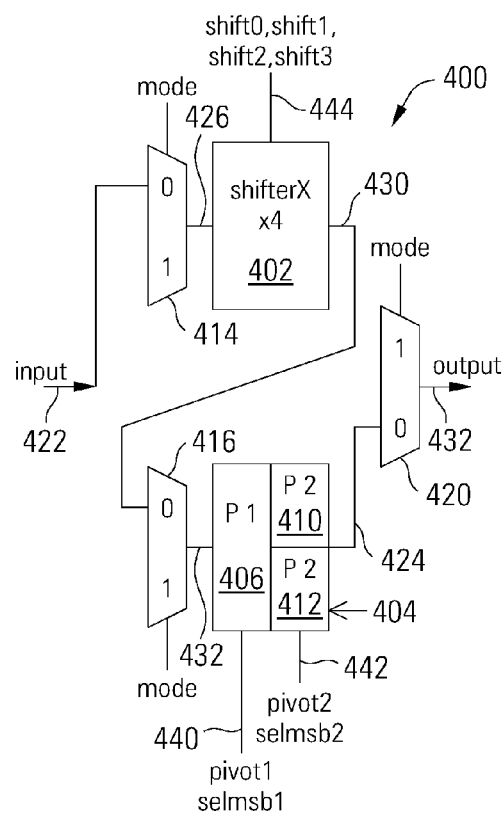
FIG. 8 depicts a block diagram of the variable barrel shifter of FIG. 4 configured to perform a delta cyclic shift on four data words of X bits to a data word of 4X bits in accordance with various embodiments of the present invention.

Turning to FIG. 8, the operation of the variable barrel shifter 400 is illustrated in mode 0, in which the data flow is reversed and the data word at the input 422 passes through multiplexer 414, four X-bit shifters 402, multiplexer 416, pre-mux 404 and multiplexer 420 to the output 432 in that order. As with FIG. 5, only a single stage of operation is illustrated, although as disclosed above, multiple stages may be performed successively by circulating data internally. The data flow is illustrated in FIG. 9, in which a 4X-bit data word (equivalently, four X-bit data words 902, 904, 906 and 910) is provided at input 422 to X-bit shifters 620, 622, 624 and 626. The X-bit shifters 620, 622, 624 and 626 each apply a data shift as disclosed above, yielding shifted X-bit data words 912, 914, 916 and 920, which are provided to first stage pre-mux 406, an array of 2-1 multiplexers that divide a 4X-bit data word made of the combination of X-bit data words 912, 914, 916 and 920 into two 2X-bit outputs 922 and 924. FIG. 9 shows shifted X-bit data words 914 and 916 being swapped to illustrate the data flow when variable barrel shifter 400, with this swap enabled in mode 0. For example, with X=3, data words of 912, 914, 916 and 920 or outputs of shifter 620, 622, 624 and 626 respectively, are {ABC, DEF, GHI, JKL}, and after swap of data words 914 and 916, the input of first stage pre-mux 406 is {ABC, GHI, DEF, JKL}. First stage pre-mux 406 is configured by setting the 2X-bit select signal Sel1[2X-1:0] 930 according to Equation 7:

$$\left\{\underbrace{\{1 \ldots 1\}}_{(X-pivot2)bits}, \underbrace{\{0 \ldots 0\}}_{pivot2 \; bits}, \atop \underbrace{\{1 \ldots 1\}}_{(X-pivot2)bits}, \underbrace{\{0 \ldots 0\}}_{pivot2 \; bits}\right\} \text{when } selmsb2 = 1 \qquad \text{(Eq 7)}$$

$$\left\{\underbrace{\{0 \ldots 0\}}_{(X-pivot2)bits}, \underbrace{\{1 \ldots 1\}}_{pivot2 \; bits}, \atop \underbrace{\{0 \ldots 0\}}_{(X-pivot2)bits}, \underbrace{\{1 \ldots 1\}}_{pivot2 \; bits}\right\} \text{when } selmsb2 = 0$$

where pivot2 is calculated according to Equations 1 and 4, and selmsb2 is calculated according to Equations 1 and 5.

The two 2X-bit outputs 922 and 924 are processed in second stage pre-mux 410 and second stage pre-mux 412, respectively, controlled by two X-bit select signals Sel2_H[X-1:0] 932 and Sel2_L[X-1:0] 934, in which the combination of X-bit select signal Sel2_H[X-1:0] 932 and Sel2_L[X-1:0] 934 is calculated according to Equation 8:

$$\left\{\underbrace{\{1 \ldots 1\}}_{(2X-pivot1)bits}, \underbrace{\{0 \ldots 0\}}_{pivot1 \; bits}\right\} \text{when } selmsb1 = 1 \qquad \text{(Eq 8)}$$

$$\left\{\underbrace{\{0 \ldots 0\}}_{(2X-pivot1)bits}, \underbrace{\{1 \ldots 1\}}_{pivot1 \; bits}\right\} \text{when } selmsb1 = 0$$

where pivot1 is calculated according to Equation 1, and selmsb1 is calculated according to Equation 2.

The second stage pre-mux 410 yields two X-bit data words 940 and 942 and second stage pre-mux 412 yields two X-bit data words 944 and 946. The overall output 432 is a 4X-bit data word formed by X-bit data words 940, 942, 944 and 946, with data words 942 and 944 swapped as illustrated in FIG. 9. As another example, with X=3, with X-bit data words 940 and 942, or the output of second stage pre-mux 410, being {MNO} and {PQR} respectively, and data words 944 and 946, or the output of second stage pre-mux 412, being {STU} and {VWX} respectively, the final output 432 of variable barrel shifter 400 is {MNO, STU, PQR, VWX} after the swap of data words 942 and 944.

The variable barrel shifter 400 may be used in either mode 0 or mode 1 to perform a shift on a 4X-bit circulant, with either mode producing the same results whether the pre-mux 404 comes before or after the four X-bit shifters 402 in the data flow. For example, when used in an LDPC decoder to perform a delta shift from one 4X-bit circulant to the next 4X-bit circulant, where the first 4X-bit circulant already has a shift of Sn1, and where the next 4X-bit circulant should have a shift of Sn2, the shift number to apply in variable barrel shifter 400 is (4X-Sn1)+Sn2, where (4X-Sn1) effectively un-shifts the first 4X-bit circulant as the Sn2 shift is applied. Similarly, the variable barrel shifter 400 may be used in either mode 0 or mode 1 to perform a shift on four X-bit circulants.

When used in an LDPC decoder to perform a delta shift from a 4X-bit circulant to a layer of four X-bit circulants, where the 4X-bit circulant has a shift of $P^{shift4X(Sn2)}$, with P={P0, P1, P2, P3}, each having X bits, the variable barrel shifter 400 yields output data of $P0^{shiftX(s0)}$, $P1^{shiftX(s1)}$, $P2^{shiftX(s2)}$, $P3^{shiftX(s3)}$, where $P^{shiftX(S)}$ refers to an S-bit left cyclic shift on data P and 0<=S<X. To accomplish this, the variable barrel shifter 400 is placed in mode 1, with initial_shift=(4X-Sn2), with pivot1, selmsb1, pivot2 and selmsb2 calculated according to equations 1, 2, 4 and 5, respectively, and with the shift values 444 calculated as shift0=pivot2+s0, shift1=pivot2+s1, shift2=pivot2+s2 and shift3=pivot2+s3.

When used in an LDPC decoder to perform a delta shift from a layer of four X-bit circulants to a 4X-bit circulant, where the input data is $P0^{shiftX(s0)}$, $P1^{shiftX(s1)}$, $P2^{shiftX(s2)}$, $P3^{shiftX(s3)}$, the variable barrel shifter 400 yields output data $P^{shift4X(Sn1)}$. To accomplish this, the variable barrel shifter 400 is placed in mode 0, with initial_shift=(Sn1), with pivot1, selmsb1, pivot2 and selmsb2 calculated according to equations 1, 2, 4 and 5, respectively, and with the shift values 444 calculated as shift0=pivot2+(X-s0), shift1=pivot2+(X-s1), shift2=pivot2+(X-s2) and shift3=pivot2+(X-s3).

In some embodiments in which the variable barrel shifter 400 is used in an LDPC decoder, the shifter parameters pivot1, selmsb1, pivot2 and selmsb2, shift0, shift1, shift2 and shift3 are pre-computed and stored in a read only memory (ROM) for all circulants based on an original parity check matrix.

With the flexible data path in the variable barrel shifter 400, a single 4X-bit shifter (implemented using four X-bit shifters 620, 622, 624 and 626) can realize the delta shift between two types of circulants by adjusting the control parameters. The variable barrel shifter 400 performs multiple shifts with a single shifter, adding just multiplexers 414, 416 and 420 rather than additional shifters.

Turning to FIG. 10, a flow diagram 1000 depicts a method for delta shifting in a variable barrel shifter in accordance with various embodiments of the present invention. The method of FIG. 10, or variations thereof, may be performed in variable barrel shifter circuits such as those illustrated in FIGS. 4-9. Following flow diagram 1000, a shift value is configured for each of a number of shift circuits in a shifter, based on a shift value input to a variable barrel shifter, configure a shift value for each of a number of shift circuits in a shifter. (Block 1002) Based on the shift value input and a mode input to the variable barrel shifter, multiple stages of multiplexer arrays are configured in a pivot circuit. (Block 1004) Based on the mode input, a data word is switched to either the shifter or a pivot circuit, then to the other of the shifter or the pivot circuit. (Block 1006) A cyclic shift is applied on the data word in the shifter (block 1010), and a pivot operation is performed on the data word in the pivot circuit. (Block 1012) As disclosed above, the shift and pivot operations may be performed in any order and may be performed repeatedly, changing the configuration of the shifter and pivot circuits to perform delta shifts between multiple data words or circulants of different sizes, numbers and initial and final shift values.

Figure 11:
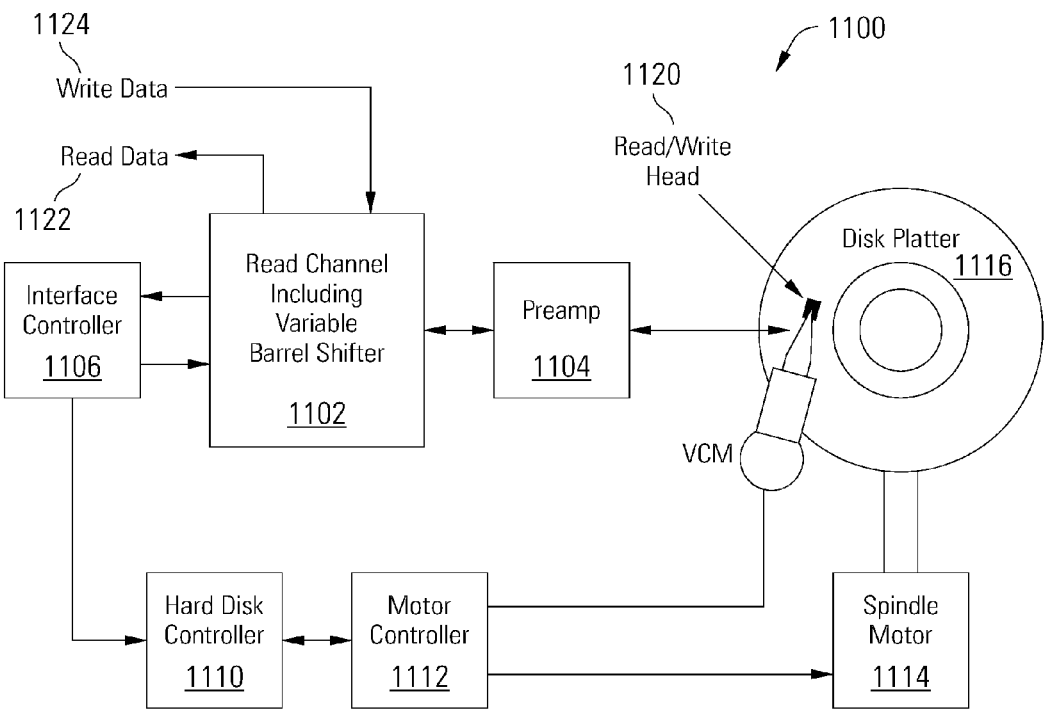
FIG. 11 depicts a storage system including an LDPC layer decoder with variable barrel shifter in accordance with some embodiments of the present invention.

Although the variable barrel shifter disclosed herein is not limited to any particular application, several examples of applications are presented herein that benefit from embodiments of the present invention. FIG. 11 shows a storage system 1100 including a read channel circuit 1102 with an LDPC decoder having a variable barrel shifter in accordance with some embodiments of the present invention. Storage system 1100 may be, for example, a hard disk drive. Storage system 1100 also includes a preamplifier 1104, an interface controller 1106, a hard disk controller 1110, a motor controller 1112, a spindle motor 1114, a disk platter 1116, and a read/write head assembly 1120. Interface controller 1106 controls addressing and timing of data to/from disk platter 1116. The data on disk platter 1116 consists of groups of magnetic signals that may be detected by read/write head assembly 1120 when the assembly is properly positioned over disk platter 1116. In one embodiment, disk platter 1116 includes magnetic signals recorded in accordance with either a longitudinal or a perpendicular recording scheme.

In a typical read operation, read/write head assembly 1120 is accurately positioned by motor controller 1112 over a desired data track on disk platter 1116. Motor controller 1112 both positions read/write head assembly 1120 in relation to disk platter 1116 and drives spindle motor 1114 by moving read/write head assembly 1120 to the proper data track on disk platter 1116 under the direction of hard disk controller 1110. Spindle motor 1114 spins disk platter 1116 at a determined spin rate (RPMs). Once read/write head assembly 1120 is positioned adjacent the proper data track, magnetic signals representing data on disk platter 1116 are sensed by read/write head assembly 1120 as disk platter 1116 is rotated by spindle motor 1114. The sensed magnetic signals are provided as a continuous, minute analog signal representative of the magnetic data on disk platter 1116. This minute analog signal is transferred from read/write head assembly 1120 to read channel circuit 1102 via preamplifier 1104. Preamplifier 1104 is operable to amplify the minute analog signals accessed from disk platter 1116. In turn, read channel circuit 1102 decodes and digitizes the received analog signal to recreate the information originally written to disk platter 1116. This data is provided as read data 1122 to a receiving circuit. As part of decoding the received information, read channel circuit 1102 processes the received signal using a variable barrel shifter. Such a variable barrel shifter may be implemented consistent with that disclosed above in relation to FIGS. 4-9. In some cases, the variable barrel shifting may be done consistent with the flow diagram disclosed above in relation to FIG. 10. A write operation is substantially the opposite of the preceding read operation with write data 1124 being provided to read channel circuit 1102. This data is then encoded and written to disk platter 1116. It should be noted that various functions or blocks of storage system 1100 may be implemented in either software or firmware, while other functions or blocks are implemented in hardware.

It should be noted that storage system 1100 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such storage system 1100, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

Figure 12:
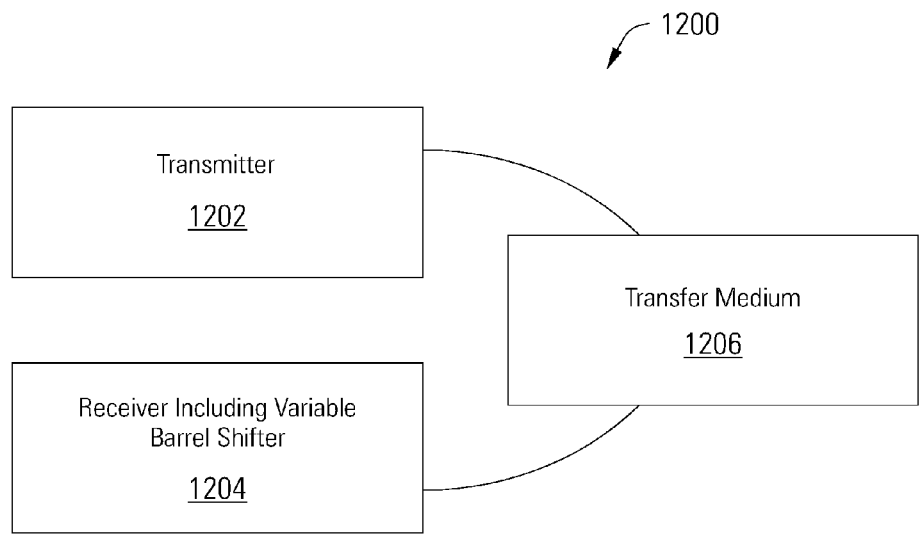
FIG. 12 depicts an example data transmission device including an LDPC layer decoder with variable barrel shifter in accordance with some embodiments of the present invention.

Turning to FIG. 12, a wireless communication system 1200 or data transmission device including a receiver 1204 with a variable barrel shifter is shown in accordance with some embodiments of the present invention. Communication system 1200 includes a transmitter 1202 that is operable to transmit encoded information via a transfer medium 1206 as is known in the art. The encoded data is received from transfer medium 1206 by receiver 1204. Receiver 1204 incorporates a variable barrel shifter. Such a variable barrel shifter may be implemented consistent with that disclosed above in relation to FIGS. 4-9. In some cases, the variable barrel shifting may be done consistent with the flow diagram disclosed above in relation to FIG. 10.

It should be noted that the various blocks discussed in the above application may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the present invention provides novel methods and apparatuses for a variable barrel shifter. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A variable barrel shifter comprising:
   a shifter configured to apply a cyclic shift to each of a plurality of portions of a data word;
   a pivot circuit configured to swap sections of the data word around at least one pivot point in the data word;
   a first multiplexer configured to select between an input of the variable barrel shifter or an output of the pivot circuit as an input to the shifter;
   a second multiplexer configured to select between the input of the variable barrel shifter or an output of the shifter as an input to the pivot circuit; and
   a third multiplexer configured to select between the output of the shifter or the output of the pivot circuit as an output to the variable barrel shifter.

2. The variable barrel shifter of claim 1, comprising a mode input configured to control the first multiplexer, the second multiplexer and the third multiplexer.

3. The variable barrel shifter of claim 2, comprising an initial shift input configured to control the pivot circuit to configure the at least one pivot point in the data word.

4. The variable barrel shifter of claim 3, further comprising a memory configured to retrieve a plurality of shift and pivot parameters for the shifter and the pivot circuit based at least in part on the initial shift input.

5. The variable barrel shifter of claim 3, wherein the pivot circuit comprises a first pivot stage and a second pivot stage.

6. The variable barrel shifter of claim 5, wherein the first pivot stage comprises a first array of multiplexers configured to divide the data word into a first upper portion and a first lower portion, wherein the first pivot stage is configured to establish a first pivot point in each of the first upper portion and the first lower portion, and to establish a first pivot section comprising either a most significant bit portion or a least significant bit portion in each of the first upper portion and the first lower portion, wherein the most significant bit portions and the least significant bit portions are bounded by the first pivot points, and wherein the first pivot stage is operable to swap the first pivot sections.

7. The variable barrel shifter of claim 6, wherein the first pivot points and the first pivot sections are set based on the initial shift input.

8. The variable barrel shifter of claim 6, wherein the second pivot stage comprises a second array of multiplexers configured to divide the first upper portion into a second upper portion and a second lower portion, and a third array of multiplexers configured to divide the first lower portion into a third upper portion and a third lower portion, and wherein the second pivot stage is configured to establish a second pivot point and a second pivot section in each of the second upper portion and the second lower portion, and to establish a third pivot point and a third pivot section in each of the third upper portion and the third lower portion, and wherein the second pivot stage is operable to swap the second pivot sections and to swap the third pivot sections.

9. The variable barrel shifter of claim 1, wherein the variable barrel shifter is configured to apply the cyclic shift over a plurality of data widths in the data word.

10. The variable barrel shifter of claim 1, wherein the shifter, the pivot circuit, the first multiplexer, the second multiplexer and the third multiplexer are implemented as an integrated circuit.

11. The variable barrel shifter of claim 1, wherein the variable barrel shifter is incorporated in a low density parity check decoder and is configured to perform delta shifts between circulants in the low density parity check decoder.

12. The variable barrel shifter of claim 1, wherein the variable barrel shifter is incorporated in a storage device.

13. The variable barrel shifter of claim 1, wherein the variable barrel shifter is incorporated in a storage system comprising a redundant array of independent disks.

14. The variable barrel shifter of claim 1, wherein the variable barrel shifter is incorporated in a data transmission device.

15. A method of shifting data in a variable barrel shifter, comprising:
   when a mode selector in the variable barrel shifter is in a first state, switching a data word to a shifter and then to a pivot circuit, and when the mode selector in the variable barrel shifter is in a second state, switching the data word to the pivot circuit and then to the shifter;
   applying a cyclic shift on the data word in the shifter; and
   performing a pivot operation on the data word in the pivot circuit.

16. The method of claim 15, wherein the variable barrel shifter is configured to circulate the data word a plurality of times through the shifter and the pivot circuit to apply a succession of shift operations.

17. The method of claim 15, wherein the variable barrel shifter is configured to apply the cyclic shift over a plurality of data widths in the data word.

18. The method of claim 15, wherein the variable barrel shifter is configured to perform a delta shift in the data word from a 4X-bit circulant to four X-bit circulants, and with a specified shift value for each of the 4X-bit circulant and the four X-bit circulants.

19. The method of claim 15, wherein the variable barrel shifter is configured to perform a delta shift in the data word from four X-bit circulants to a 4X-bit circulant, and with a specified shift value for each of the 4X-bit circulant and the four X-bit circulants.

20. A storage system comprising:
- a storage medium maintaining a data set;
- a write head configured to magnetically record the data set to the storage medium; and
- a low density parity check decoder with a variable barrel shifter comprising:
  - a shifter configured to apply a cyclic shift to each of a plurality of portions of a data word in the data set;
  - a pivot circuit configured to swap sections of the data word around at least one pivot point in the data word;
  - a first multiplexer configured to select between an input of the variable barrel shifter or an output of the pivot circuit as an input to the shifter;
  - a second multiplexer configured to select between the input of the variable barrel shifter or an output of the shifter as an input to the pivot circuit; and
  - a third multiplexer configured to select between the output of the shifter or the output of the pivot circuit as an output to the variable barrel shifter.

* * * * *